(12) United States Patent
Krishnan et al.

(10) Patent No.: US 8,856,615 B1
(45) Date of Patent: Oct. 7, 2014

(54) DATA STORAGE DEVICE TRACKING LOG-LIKELIHOOD RATIO FOR A DECODER BASED ON PAST PERFORMANCE

(75) Inventors: Anantha Raman Krishnan, Irvine, CA (US); Shayan S. Garani, Irvine, CA (US); Kent D. Anderson, Broomfield, CO (US); Shafa Dahandeh, Laguna Niguel, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 67 days.

(21) Appl. No.: 13/493,856

(22) Filed: Jun. 11, 2012

(51) Int. Cl.
*G11C 29/42* (2006.01)
*H03M 13/29* (2006.01)
*G11C 29/54* (2006.01)
*G06F 11/10* (2006.01)

(52) U.S. Cl.
CPC ........ *G06F 11/1076* (2013.01); *G06F 11/1008* (2013.01); *H03M 13/2957* (2013.01)
USPC .......................................... 714/763; 714/718

(58) Field of Classification Search
CPC ............ G06F 11/1076; G06F 11/1008; G06F 13/2957; G06F 11/1068; H04L 1/0057; H04L 1/0045
See application file for complete search history.

(56) References Cited

U.S. PATENT DOCUMENTS

| | | | |
|---|---|---|---|
| 6,895,547 B2 | 5/2005 | Eleftheriou et al. | |
| 7,072,417 B1 | 7/2006 | Burd et al. | |
| 7,656,707 B2 * | 2/2010 | Kozlov | 365/185.05 |
| 7,904,783 B2 | 3/2011 | Brandman et al. | |
| 7,966,550 B2 | 6/2011 | Mokhlesi et al. | |
| 8,090,999 B2 | 1/2012 | Roohparvar | |
| 2003/0037298 A1 | 2/2003 | Eleftheriou et al. | |
| 2004/0225949 A1 * | 11/2004 | Coombs et al. | 714/796 |
| 2009/0193313 A1 * | 7/2009 | Kong et al. | 714/755 |
| 2009/0307561 A1 * | 12/2009 | Kanaoka | 714/752 |
| 2010/0251076 A1 | 9/2010 | Wu et al. | |
| 2011/0072331 A1 | 3/2011 | Sakaue et al. | |
| 2011/0188365 A1 * | 8/2011 | Maeto | 369/59.22 |
| 2011/0208897 A1 | 8/2011 | Lee et al. | |
| 2011/0239089 A1 | 9/2011 | Haratsch et al. | |
| 2011/0252289 A1 | 10/2011 | Patapoutian et al. | |
| 2011/0280069 A1 * | 11/2011 | Patapoutian et al. | 365/185.03 |
| 2012/0079355 A1 * | 3/2012 | Patapoutian et al. | 714/780 |
| 2012/0311402 A1 * | 12/2012 | Tseng et al. | 714/763 |

* cited by examiner

*Primary Examiner* — Guerrier Merant
*Assistant Examiner* — Dipakkumar Gandhi

(57) ABSTRACT

A data storage device is disclosed comprising a non-volatile memory (NVM). First data is written to a first area of the NVM, and a first estimated data sequence is read from the first area of the NVM. The first estimated data sequence is first decoded, and a log-likelihood ratio (LLR) is first updated based on the first decode. Second data is written to a second area of the NVM, and a second estimated data sequence is read from the second area of the non-volatile memory. The second estimated data sequence is second decoded in response to the first updated LLR, and the LLR is second updated based on the second decode.

24 Claims, 4 Drawing Sheets

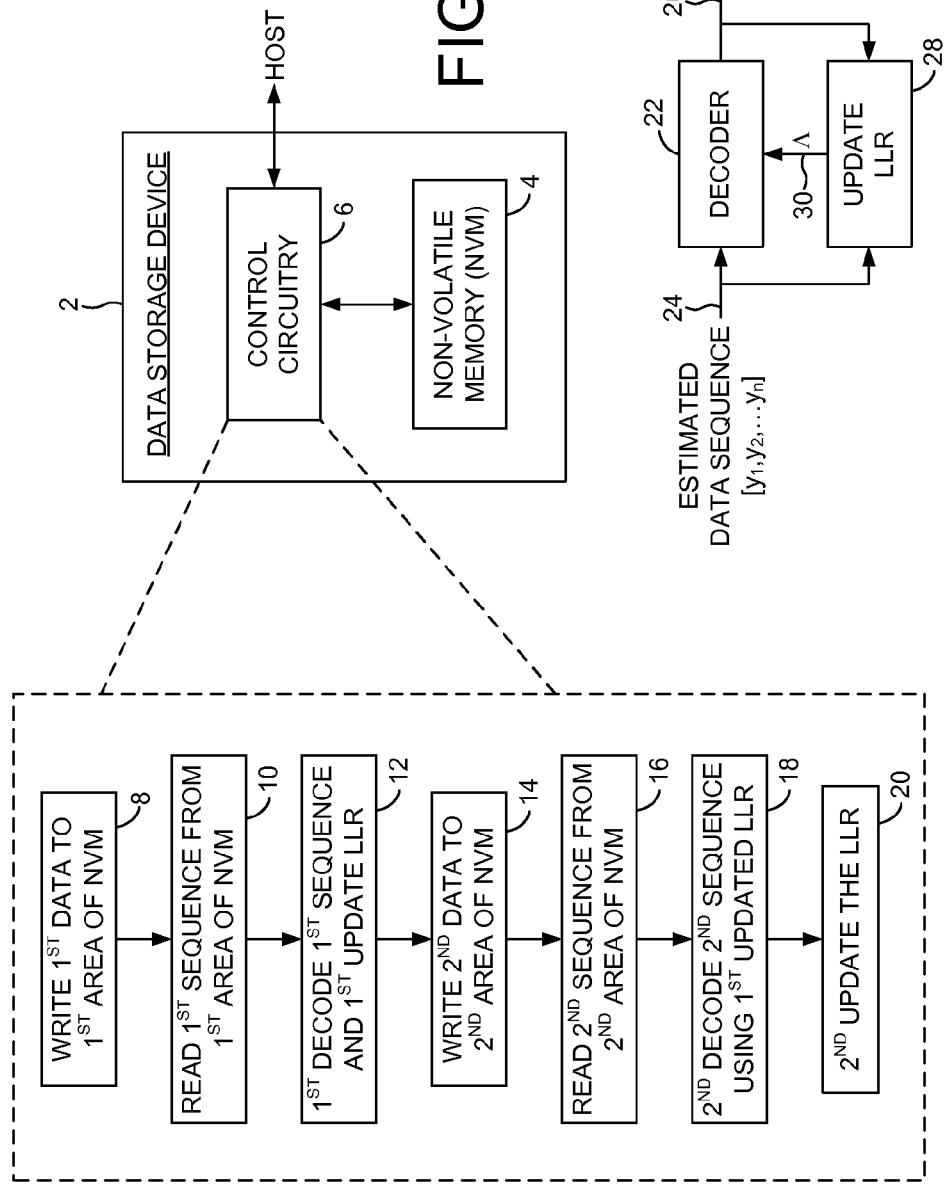

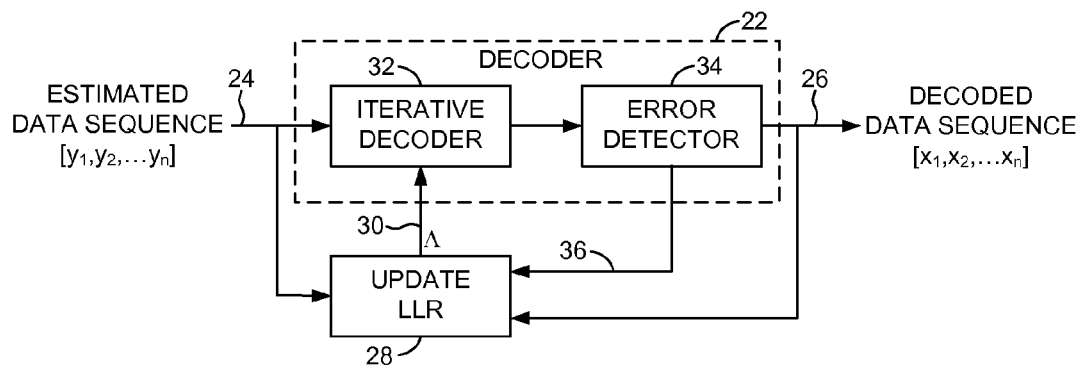
FIG. 2A
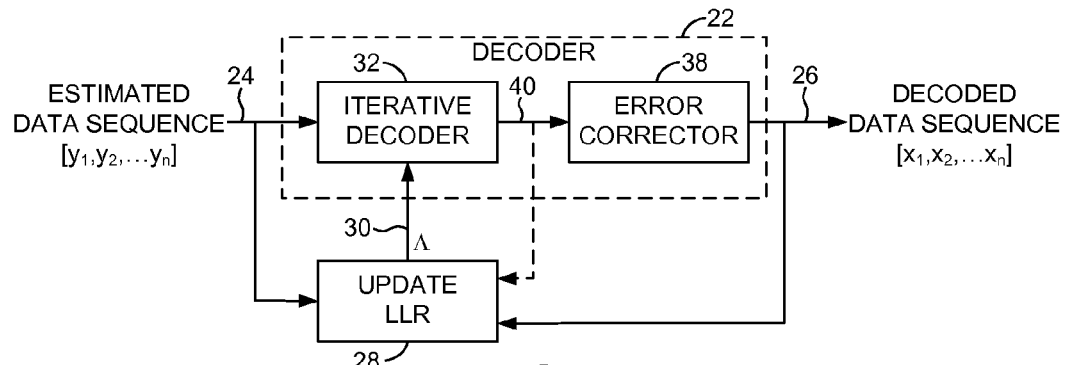
FIG. 2B
x = 000101101100010110101111101100101010100
y = 000111101101010110111011010000100010110
FIG. 3A
| PATTERN $[x_{i-1}, x_i, x_{i+1}]$ | NUMBER OF OCCURENCES | NUMBER CORRECT | NUMBER INCORRECT |
|---|---|---|---|
| 000 | 2 | 1 | 1 |
| 001 | 3 | 3 | 0 |
| 010 | 8 | 5 | 3 |
| 011 | 4 | 4 | 0 |
| 100 | 3 | 2 | 1 |
| 101 | 9 | 7 | 2 |
| 110 | 4 | 4 | 0 |
| 111 | 2 | 1 | 1 |
FIG. 3B

DATA STORAGE DEVICE TRACKING LOG-LIKELIHOOD RATIO FOR A DECODER BASED ON PAST PERFORMANCE

BACKGROUND

Data storage devices (DSDs), such as disk drives and solid state drives are employed in numerous areas such as computer systems (e.g., desktops, laptops, portables, etc.) and consumer devices (e.g., music players, cell phones, cameras, etc.). User data is typically stored in a non-volatile memory (NVM), such as a magnetic disk or a non-volatile semiconductor memory (e.g., Flash memory). During read operations, an estimated data sequence is read from the NVM and then decoded in order to correct errors in the estimated data sequence.

In a disk drive, a read channel typically samples the read signal emanating from the head to generate sample values that are equalized into a target response (e.g., a target partial response). A sequence detector detects an estimated data sequence from the equalized samples, and errors in the estimated data sequence are corrected, for example, using an iterative decoder such as a Turbo Code decoder, Low Density Parity Check (LDPC) decoder, or any suitable message passing decoder (a.k.a. belief propagation decoder). In DSDs employing a non-volatile semiconductor memory, the voltage levels read from the memory cells are compared to a threshold in order to generate the estimated data sequence which may be similarly decoded using a suitable iterative decoder (Turbo Code, LDPC, etc.).

BRIEF DESCRIPTION OF THE DRAWINGS

FIG. 1A shows a DSD according to an embodiment of the present invention comprising an NVM and control circuitry.

FIG. 1B is a flow diagram according to an embodiment of the present invention wherein a log-likelihood ratio (LLR) of a decoder is updated over multiple read operations in order to track the performance of the NVM.

FIG. 1C shows control circuitry for updating the LLR over the multiple read operations according to an embodiment of the present invention.

FIG. 2A shows an embodiment of the present invention wherein an error detection code is used to detect errors made by an iterative decoder.

FIG. 2B shows an embodiment of the present invention wherein an error correction code is used to correct errors made by an iterative decoder.

FIGS. 3A and 3B illustrate an embodiment of the present invention wherein a test pattern is written to and read from the NVM, and the error rate of each three bit sequence is tracked in order to initialize the LLRs.

DETAILED DESCRIPTION OF EMBODIMENTS OF THE INVENTION

Figure 4:
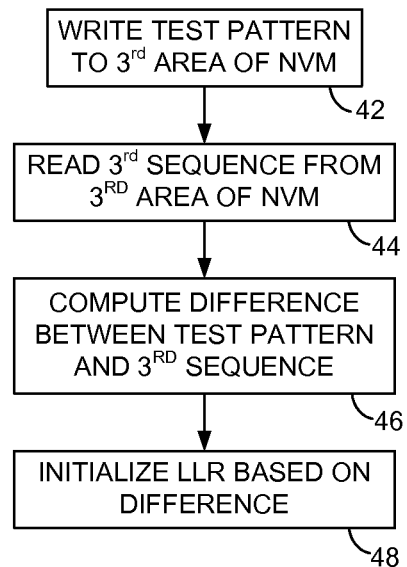
FIG. 4 is a flow diagram according to an embodiment of the present invention for initializing the LLR.

FIG. 1A shows a data storage device (DSD) 2 comprising a non-volatile memory (NVM) 4 and control circuitry 6 operable to execute the flow diagram of FIG. 1B wherein first data is written to a first area of the NVM (block 8). A first estimated data sequence is read from the first area of the NVM (block 10), the first estimated data sequence is first decoded (block 12), and a log-likelihood ratio (LLR) is first updated based on the first decode. Second data is written to a second area of the NVM (block 14), a second estimated data sequence is read from the second area of the NVM (block 16), the second estimated data sequence is second decoded in response to the first updated LLR (block 18), and the LLR is second updated based on the second decode (block 20).

FIG. 1C shows example components within the control circuitry 6 of FIG. 1A, including a suitable decoder 22 for decoding an estimated data sequence 24 $[y_1, y_2, \ldots y_n]$ into a decoded data sequence 26 $[x_1, x_2, \ldots x_n]$. The estimated data sequence 24 may be generated in any suitable manner, such as with a Viterbi detector in a disk drive, or a slicer in a DSD employing a non-volatile semiconductor memory (e.g., flash). The decoded data sequence 26 is processed in order to update 28 an LLR 30 used by the decoder 22 to decode the next estimated data sequence 24. In one embodiment, the LLR 30 is updated based on a difference between the estimated data sequence 24 and the decoded data sequence 26 (i.e., based on the errors in the estimated data sequence 24). For example, an LLR 30 may be associated with a sequence of bits (e.g., two or three consecutive bits), wherein the LLR of a target bit is based on the value of the adjacent bit(s). This embodiment is described in greater detail below with reference to FIGS. 3A and 3B.

In one embodiment, the decoder 22 in FIG. 1C employs a suitable coding technique to verify the decoded data sequence 26 is error free so that the LLR 30 is updated accurately. FIG. 2A shows an example of this embodiment wherein the decoder 22 comprises a suitable iterative decoder 32 (e.g., a Turbo Code decoder or a Low Density Parity Check (LDPC) decoder), and an error detector 34. The error detector 34 implements a suitable error detection code, such as a suitable cyclic redundancy check (CRC) code. When the output of the iterative decoder 32 is error free, the error detector 34 outputs the decoded data sequence 26 and enables the updating 28 of the LLR 30 over line 36. Otherwise, the error detector 34 signals an error condition and disables the updating 28 of the LLR 30.

FIG. 2B shows an alternative embodiment of the present invention wherein the decoder 22 comprises an error corrector 38 that implements a suitable error correction code, such as a suitable Reed-Solomon code, in order to correct errors in the output 40 of the iterative decoder 32. The corrected data sequence 26 represents the decoded data sequence used to update 28 the LLR 30. In one embodiment, the LLR 30 may be updated (e.g., biased) based on the errors corrected by the error corrector 38 in the output 40 of the iterative decoder 32. For example, when the iterative decoder 32 makes an error in a sequence of bits (or symbols), the corresponding LLR for that sequence of bits (or symbols) may be reduced to reflect the increased probability the iterative decoder 32 will make the same error when decoding future estimated data sequences 24.

Any suitable LLR 30 may be tracked in order to improve performance of the decoder 22 based on past performance. In one embodiment, the LLR 30 corresponds to a plurality of consecutive bits (or symbols), such as two consecutive bits or three consecutive bits. Consider an embodiment where the LLR 30 corresponds to three consecutive bits such that the decoding probability of the middle bit y in each three bit sequence of the estimated data sequence 24 is based on the value of the adjacent bits $[x_{i-1}, x_{x+1}]$.

In one embodiment when decoding the estimated data sequence 24 [$y_1, y_2, \ldots y_n$], the adjacent bits [$x_{i-1}, x_{i+1}$] in the decoded data sequence 26 [$x_1, x_2, \ldots x_n$] are represented as the adjacent bits [$y_{i-1}, y_{i-1}$] in the estimated data sequence 24 [$y_1, y_2, \ldots y_n$]. That is, the bits [$y_{i-1}, y_{i+1}$] adjacent to a bit $y_i$ are assumed to be correct in order to lookup a corresponding LLR for each bit $y_i$ in the estimated data sequence 24 [$y_1, y_2, \ldots y_n$]. The corresponding LLRs 30 for each bit $y_i$ in the estimated data sequence 24 [$y_1, y_2, \ldots y_n$] are then input into the decoder 22. In the embodiment where the decoder 22 comprises an iterative decoder 32 (FIG. 2A), the adjacent bits [$y_{i-1}, y_{i+1}$] in the estimated data sequence may change after each iteration of the decoding algorithm, and therefore after each iteration there may be a corresponding change to the LLR 30 for each bit $y_i$ of the estimated data sequence. In one embodiment, the LLR 30 for each bit $y_i$ may be used to bias the LLRs generated internally by the iterative decoder 32 at the beginning of each new iteration of the decoding algorithm.

In one embodiment, an LLR $\hat{\Lambda}_i(y_i, L_i)$ may be generated for each three bit sequence in the estimated data sequence 24:

$$\hat{\Lambda}(y,L) = [\hat{\Lambda}_1(y_1,L_1), \hat{\Lambda}_2(y_2,L_2), \ldots \hat{\Lambda}_n(y_n,K_n)]$$

where $L_i = [x_{i-1}, x_{i+1}]$. Each LLR may be defined as:

$$\hat{\Lambda}_i(y_i, \underline{L_i}) = \log\left[\frac{P(y_i | x_i = 0, \underline{L_i})}{P(y_i | x_i = 1, \underline{L_i})}\right] \quad (1)$$

In one embodiment, the above LLRs may be initialized by writing a test pattern to the NVM 4, reading the test pattern from the NVM 4, and evaluating the difference between the resulting estimated data sequence and the test pattern. This embodiment is illustrated in FIG. 3A wherein a test pattern x is written to the NVM 4 (the test pattern is the same as the decoded data sequence 26). The test pattern x is read from the NVM 4 to generate an estimated data sequence y. The probabilities for generating the initial LLRs may be computed according to:

$$P(y_i | x_i, \underline{L_i}) = \frac{\#(y_i, x_i, \underline{L_i})}{\#(x_i, \underline{L_i})} \quad (2)$$

where #($y_i, x_i, L_i$) is the total number of occurrences of the three bit sequence being ($x_i, L_i$) with the corresponding read value being $y_i$, and #($x_i, L_i$) is the total number of occurrences of the three bit sequence ($x_i, L_i$).

FIG. 3B is a table showing the number of occurrence of each three bit sequence in the test pattern x of FIG. 3A. For the first row corresponding to the three bit sequence [000], there are two occurrences in x (FIG. 3A) with one occurrence in the estimated data sequence y being correct and one occurrence being incorrect. Therefore, $$P(y_i=0 | x_i=0, L_i=[x_{i-1}=0, x_{i+1}=0]) = 0.5; \text{ and}$$

$$P(y_i=1 | x_i=0, L_i=[x_{i-1}=0, x_{i+1}=0]) = 0.5$$

A similar probability can be computed for each three bit sequence shown in FIG. 3B in order to initialize the LLRs using the above equation (1).

FIG. 4 is a flow diagram according to an embodiment of the present invention illustrating the process of initializing the LLRs. A test pattern is written to a third area of the NVM (block 42), and the test pattern is read in order to generate a third estimated data sequence (block 44). A difference is computed between the test pattern and the third estimated data sequence (block 46), and the LLRs are initialized based on the difference (block 48) as described above.

Figure 5:
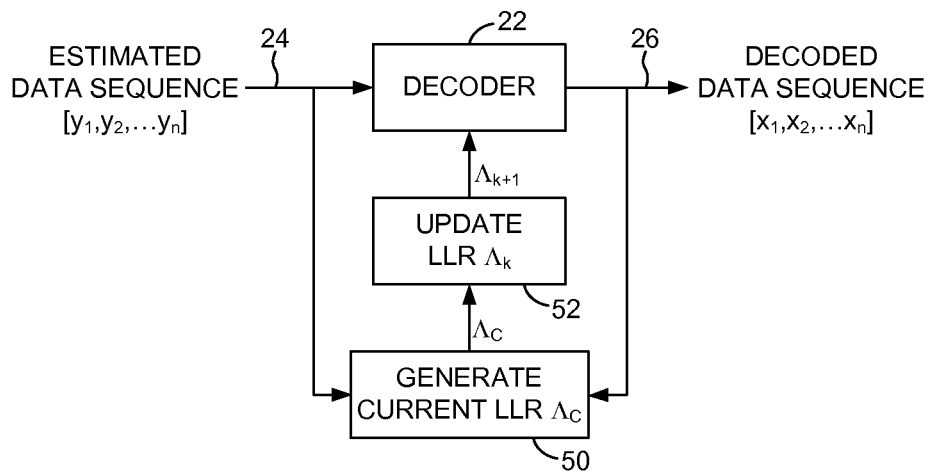
FIG. 5 shows control circuitry according to an embodiment of the present invention for computing a current LLR for a current read operation which is used to update a historical LLR used by the decoder to decode future read operations.

FIG. 5 illustrates an embodiment of the present invention wherein a current LLR $\hat{\Lambda}_c$ is generated 50 for a current estimated data sequence 24 by reading an area of the NVM 4 during normal operation and decoding the estimated data sequence 24 into the decoded data sequence 26 using the previously generated LLR $\hat{\Lambda}_k$. The current LLR $\hat{\Lambda}_c$ is generated 50 by computing the probabilities using equation (2) above based on the difference between the estimated data sequence 24 and the decoded data sequence 26. The current LLR $\hat{\Lambda}_c$ is then used to update 52 the previously generated LLR $\hat{\Lambda}_k$ to generate an updated LLR $\hat{\Lambda}_{k+1}$ for use in decoding the next estimated data sequence 24. In one embodiment, the LLR is updated 52 according to:

$$\hat{\Lambda}_{k+1} = \beta \hat{\Lambda}_k + (1-\beta)\hat{\Lambda}_c; 0 < \beta < 1$$

where $\beta$ is a learning coefficient. In one embodiment, the learning coefficient $\beta$ may be adjusted based on any suitable operating parameter, such as decreasing the learning coefficient $\beta$ as a number of program/erase cycles of the NVM 4 increases so that the current LLR $\hat{\Lambda}_c$ causes a more significant change in the updated LLR $\hat{\Lambda}_{k+1}$.

Other embodiments of the present invention may track different LLRs based on different operating conditions. For example, in one embodiment an LLR may be generated for each three bit sequence in the estimated data sequence 24 as described above, and in addition each LLR may be generated for one or more operating conditions. Any suitable operating condition may be tracked, such as a retention time of data stored in the NVM 4. This may be of particular concern when the NVM 4 comprises a non-volatile semiconductor memory (e.g., flash) wherein the reliability of the stored data is affected by how long the data has been stored. In this embodiment, an array of LLRs is generated for each three bit sequence, wherein each element in the array corresponds to a different operating condition (e.g., retention time). Other operating conditions that may be tracked within the array include the ambient temperature over the retention time, or a number of proximate write operations (write disturb) that may affect a particular storage area within the NVM 4. When a particular area of the NVM 4 is read, the LLRs in the array corresponding to the relevant operating condition(s) is selected to decode the estimated data sequence, and then the LLR for the array entry is updated based on the decoding result.

Figure 6:
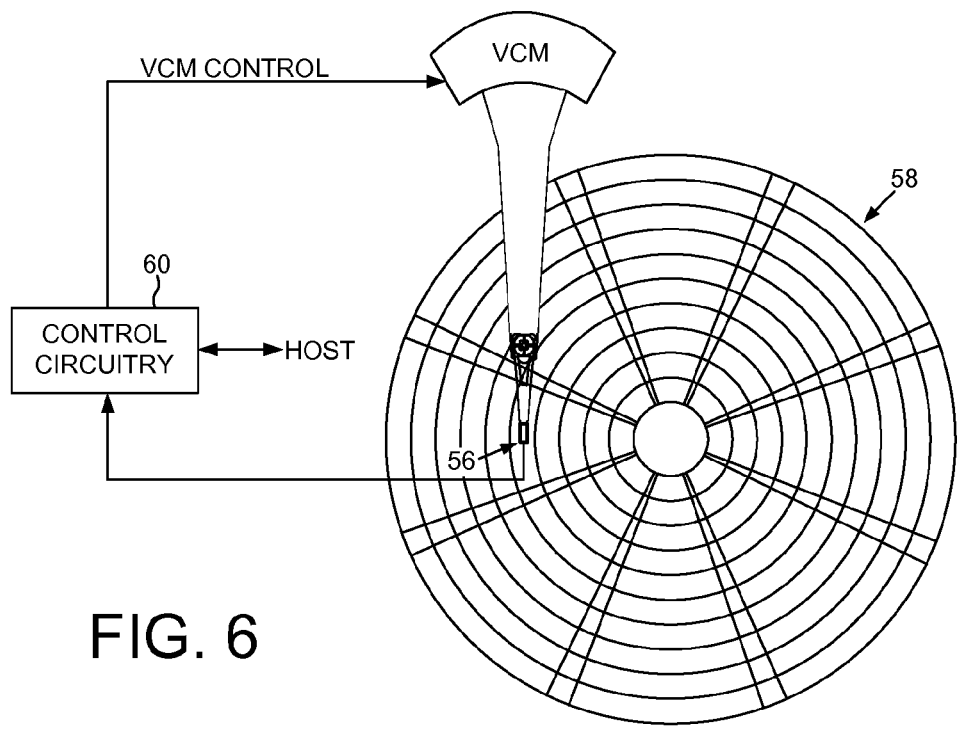
FIG. 6 shows an embodiment of the present invention wherein the NVM comprises a disk of a disk drive.
Figure 7:
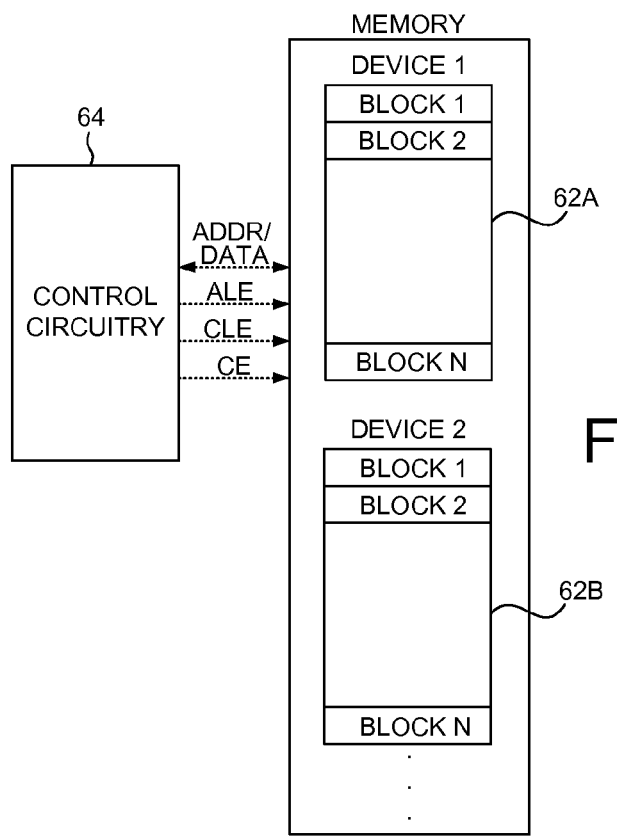
FIG. 7 shows an embodiment of the present invention wherein the NVM comprises a non-volatile semiconductor memory.

The embodiments of the present invention may be employed in any suitable DSD comprising any suitable non-volatile memory. FIG. 6 shows a DSD comprising a disk drive including a head 56 actuated over a disk 58 and control circuitry 60. FIG. 7 shows a DSD comprising a solid state drive including a plurality of non-volatile semiconductor memories 62A, 62B, etc., such as flash memories, and control circuitry 64. A hybrid DSD may also be employed comprising components of a disk drive shown in FIG. 6 combined with the non-volatile semiconductor memories shown in FIG. 7.

Any suitable control circuitry may be employed in the embodiments of the present invention, such as one or more integrated circuits. In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored in a non-volatile memory and read into a volatile semiconductor memory when the DSD is powered on. In yet another embodiment, the control circuitry comprises suitable logic circuitry, such as state machine circuitry.

What is claimed is:

1. A data storage device comprising:
a non-volatile memory (NVM); and
control circuitry operable to:
  write first data to a first area of the NVM;
  read a first estimated data sequence comprising a first plurality of bits from the first area of the NVM;
  first decode the first estimated data sequence;
  first update a log-likelihood ratio (LLR) based on the first decode;
  write second data to a second area of the NVM;
  read a second estimated data sequence comprising a second plurality of bits from the second area of the NVM;
  second decode the second estimated data sequence in response to the first updated LLR, where each updated LLR corresponds to a target bit in a plurality of consecutive bits in the second plurality of bits; and
  second update the LLR based on the second decode.

2. The data storage device as recited in claim 1, wherein the control circuitry is further operable to second update the LLR based on a difference between the second estimated data sequence and the second decode.

3. The data storage device as recited in claim 1, wherein the control circuitry is further operable to:
  write a test pattern to a third area of the NVM;
  read a third estimated data sequence from the third area of the NVM; and
  initialize the LLR based on a difference between the test pattern and the third estimated data sequence.

4. The data storage device as recited in claim 1, wherein the control circuitry is further operable to:
  first decode the first estimated data sequence by correcting an error in the first estimated data sequence; and
  first update the LLR based on the corrected error.

5. The data storage device as recited in claim 1, wherein the consecutive bits comprises at least two consecutive bits.

6. The data storage device as recited in claim 1, wherein the consecutive bits comprises at least three consecutive bits.

7. The data storage device as recited in claim 1, wherein the control circuitry is further operable to:
  track a plurality of LLRs each corresponding to an operating condition; and
  first update the LLR that corresponds to the operating condition when first decoding the first estimated data sequence.

8. The data storage device as recited in claim 7, wherein the operating condition comprises a retention time of data stored in the NVM.

9. The data storage device as recited in claim 8, wherein the operating condition comprises an ambient temperature over the retention time.

10. The data storage device as recited in claim 7, wherein the NVM comprises a non-volatile semiconductor memory and the operating condition comprises a number of program/erase cycles of the non-volatile semiconductor memory.

11. The data storage device as recited in claim 1, wherein the NVM comprises a non-volatile semiconductor memory.

12. The data storage device as recited in claim 1, wherein the NVM comprises a disk of a disk drive.

13. A method of operating a data storage device comprising a non-volatile memory (NVM), the method comprising:
  writing first data to a first area of the NVM;
  reading a first estimated data sequence comprising a first plurality of bits from the first area of the NVM;
  first decoding the first estimated data sequence;
  first updating a log-likelihood ratio (LLR) based on the first decode;
  writing second data to a second area of the NVM;
  reading a second estimated data sequence comprising a second plurality of bits from the second area of the NVM;
  second decoding the second estimated data sequence in response to the first updated LLR, where each updated LLR corresponds to a target bit in a plurality of consecutive bits in the second plurality of bits; and
  second updating the LLR based on the second decode.

14. The method as recited in claim 13, further comprising second updating the LLR based on a difference between the second estimated data sequence and the second decode.

15. The method as recited in claim 13, further comprising:
  writing a test pattern to a third area of the NVM;
  reading a third estimated data sequence from the third area of the NVM; and
  initializing the LLR based on a difference between the test pattern and the third estimated data sequence.

16. The method as recited in claim 13, further comprising:
  first decoding the first estimated data sequence by correcting an error in the first estimated data sequence; and
  first updating the LLR based on the corrected error.

17. The method as recited in claim 13, wherein the consecutive bits comprises at least two consecutive bits.

18. The method as recited in claim 13, wherein the consecutive bits comprises at least three consecutive bits.

19. The method as recited in claim 13, further comprising:
  tracking a plurality of LLRs each corresponding to an operating condition; and
  first updating the LLR that corresponds to the operating condition when first decoding the first estimated data sequence.

20. The method as recited in claim 19, wherein the operating condition comprises a retention time of data stored in the NVM.

21. The method as recited in claim 20, wherein the operating condition comprises an ambient temperature over the retention time.

22. The method as recited in claim 19, wherein the NVM comprises a non-volatile semiconductor memory and the operating condition comprises a number of program/erase cycles of the non-volatile semiconductor memory.

23. The method as recited in claim 13, wherein the NVM comprises a non-volatile semiconductor memory.

24. The method as recited in claim 13, wherein the NVM comprises a disk of a disk drive.

* * * * *